United States Patent [19]

Horton

[11] Patent Number: 5,802,450
[45] Date of Patent: Sep. 1, 1998

[54] TRANSMIT SEQUENCING

[75] Inventor: Robert R. Horton, Apex, N.C.

[73] Assignee: Ericsson Inc., Research Triangle Park, N.C.

[21] Appl. No.: 634,723

[22] Filed: Apr. 19, 1996

[51] Int. Cl.$^6$ ........................................... H04B 1/04
[52] U.S. Cl. ........................... 455/114; 455/75; 455/127; 455/260; 331/17
[58] Field of Search ........................ 455/75, 76, 113, 455/114, 117, 118, 119, 127, 260; 331/17

[56] References Cited

U.S. PATENT DOCUMENTS

| | | | |
|---|---|---|---|
| 5,142,246 | 8/1992 | Petersson | 331/11 |
| 5,175,729 | 12/1992 | Borras et al. | 370/79 |
| 5,438,703 | 8/1995 | Ng et al. | 455/127 |
| 5,463,351 | 10/1995 | Marko et al. | 331/1 A |
| 5,498,998 | 3/1996 | Gehrke et al. | 331/17 |
| 5,499,392 | 3/1996 | Grunwell | 455/260 |
| 5,559,474 | 9/1996 | Matsumoto | 331/17 |

FOREIGN PATENT DOCUMENTS

| | | |
|---|---|---|
| 664 617 | 7/1995 | European Pat. Off. |
| 2 289 386 | 11/1995 | United Kingdom . |

*Primary Examiner*—Nguyen Vo
*Assistant Examiner*—Darnell R. Armstrong
*Attorney, Agent, or Firm*—Burns, Doane, Swecker & Mathis, L.L.P.

[57] ABSTRACT

A method and apparatus for initializing a radio transmission apparatus comprising a voltage control oscillator, a phase lock loop, and a power amplifier is disclosed so as to avoid generating unwanted interference in neighboring radio channels. First, the voltage control oscillator is enabled and the phase locked loop is switched from a narrow band mode to a wide bandwidth mode to give faster settling time and reduced overshoot. The power amplifier is then smoothly ramped up to a final power level. Finally, the phase locked loop is switched from the wide bandwidth mode to the narrow bandwidth mode after the power amplifier has substantially reached the final power level.

15 Claims, 6 Drawing Sheets

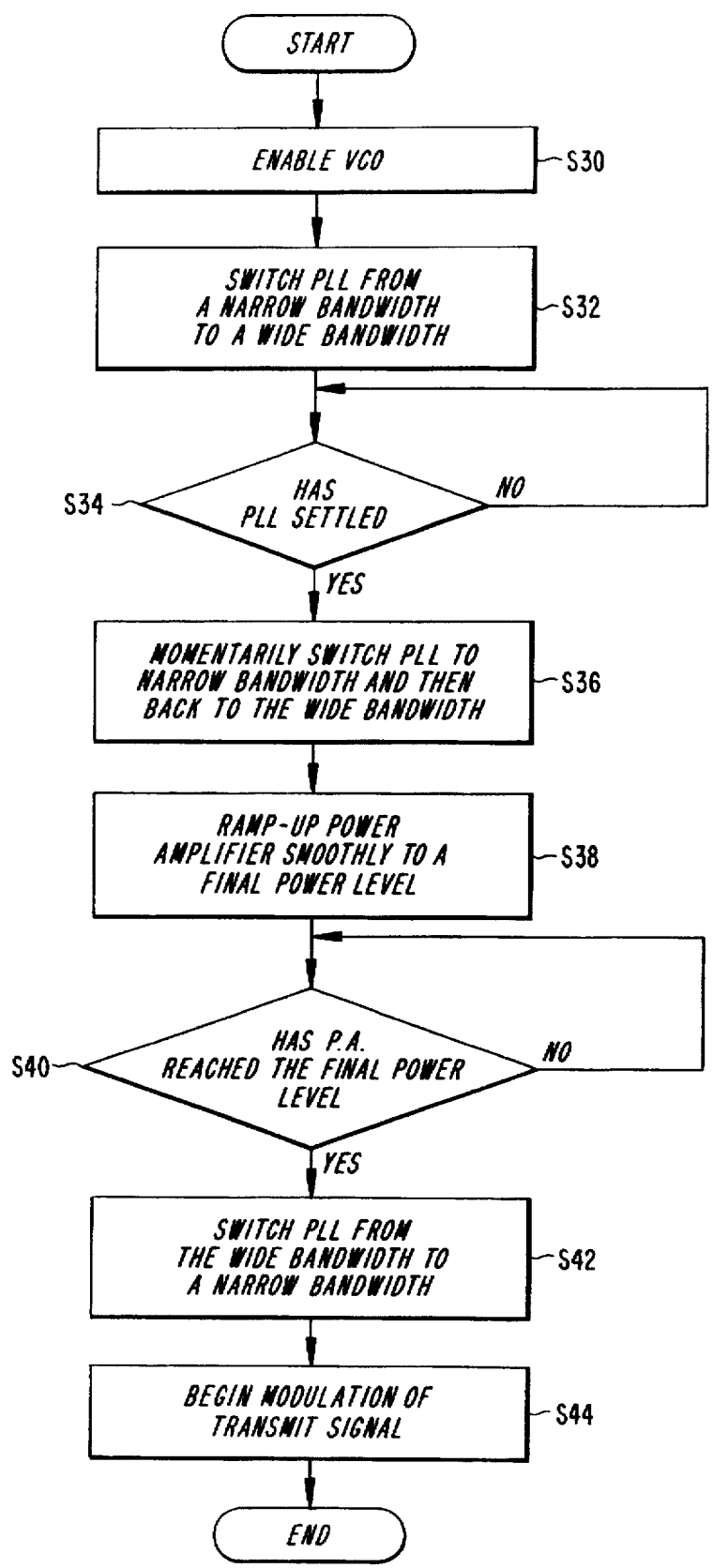

TRANSMIT SEQUENCING

FIELD OF THE INVENTION

The present invention relates to a phase locked loop circuit and a transmitter circuit of an intermittent radio transmission apparatus, and more particularly to the sequencing of switching a transmitter on/off so as to avoid generating unwanted interference in neighboring channels.

BACKGROUND OF THE INVENTION

A phase locked loop is a well known circuit which typically includes a phase detector, a filter, and a voltage controlled oscillator. A stable input signal or reference signal is applied to the phase detector which compares the input signal to the output of the voltage controlled oscillator. The output signal of the phase detector is representative of the phase difference between the input signal and the output signal of the voltage controlled oscillator. The output signal of phase detector is filtered. The filtered signal is then used as an error signal to control the voltage controlled oscillator, thereby causing the frequency of the voltage controlled oscillator to track the frequency of the stable input signal.

In communication systems, phase locked loops are used to generate transmit signals. As illustrated in FIG. 1, a phase locked loop 10 may be represented by a combination of three basic components: a phase detector 12; a loop filter 14; and a voltage controlled oscillator (VCO) 16, wherein the loop filter 14 is connected to the output signal of the phase detector 12 and the control input of the VCO 16. The phase detector 12 compares the phase of a periodic input signal or reference frequency against the phase of the signal produced by the VCO 16. The difference voltage signal generated by the phase detector 12 is a measure of the phase difference between the two input signals. The difference voltage signal is filtered by the loop filter 14 to produce a control voltage which is then applied to the VCO 16. In this example, the loop filter 14 is comprised of a resistor $R_1$ and capacitors $C_1$ and $C_2$. The application of the control voltage to the VCO 16 changes the frequency of an output signal produced by the VCO 16 in a direction that reduces the phase difference between the input signal and the reference source.

The overall transfer function of the phase locked loop (PLL) determines the response of the system due to input phase/frequency errors. Two important performance measures of the systems response to input errors are lock time and overshoot. The lock time is defined as the time required for the PLL to settle within an established value of the correct frequency due to an error input. The lock time is primarily a function of the PLL transfer function bandwidth and dampening factor. In general, for a constant dampening factor, the wider the loop bandwidth, the faster the system response to an error input and the shorter the lock time. The overshoot is defined as the amount the system's output response proceeds beyond the desired response due to an error input. The overshoot is primarily a function of the PLL's dampening factor. In general, the larger the dampening factor the lower the system overshoot due to an error input. The transfer function bandwidth and dampening factor are primarily determined by the loop filter elements $R_1$, $C_1$, and $C_2$.

In radio communication systems, a radio frequency oscillator generates a transmit signal which is amplified by a transmit power amplifier as illustrated in FIG. 2. The oscillator frequency is controlled to a desired value by the phase locked loop which can include application of frequency modulation with information signals. However, two conflicting requirements arise when the transmitter begins transmission. First, if the phase locked loop does include frequency modulation with information signals, the transfer function bandwidth must be lower than the lowest frequency contained in the information signal or else the phase locked loop will treat the information signal as an error input and will correct for it, effectively removing the desired modulation. Thus, the loop bandwidth must be narrow if the phase locked loop is to include frequency modulation. Secondly, if the transmitter power amplifier is turned on or off after the oscillator has settled to the desired frequency, the oscillator which is operating will be pulled momentarily to an incorrect frequency due to the sudden change of the power amplifier loading. The amount of overshoot and settling time introduced by the turning on/off of the transmitter power amplifier is significantly greater for a system with a narrow transfer function bandwidth when compared to an equivalent system with a wider transfer function bandwidth and high dampening factor. This can be a significant problem since the oscillator which is operating at the incorrect frequency may interfere with neighboring radio channels. In addition, the Federal Communications Commission places regulations on cellular systems wherein a cellular operator cannot transmit outside its assigned frequency band even momentarily. Thus, there is a need for a method and apparatus for controlling the operation of the transmitter and/or phase locked loop so as to avoid generating unwanted interference in neighboring channels.

SUMMARY OF THE INVENTION

It is an object of the present invention to overcome the deficiencies cited above by providing a method and apparatus for initializing a radio transmission apparatus so as to avoid generating unwanted interference in neighboring radio channels.

According to one embodiment of the present invention, a method for initializing a radio transmission apparatus comprising a voltage control oscillator, a phase lock loop, and a power amplifier is disclosed so as to avoid generating unwanted interference in neighboring radio channels. First, the voltage control oscillator is enabled and the phase locked loop is switched from a narrow band mode to a wide bandwidth mode to give faster settling time and reduced overshoot. The power amplifier is then smoothly ramped up to a final power level. Finally, the phase locked loop is switched from the wide bandwidth mode to the narrow bandwidth mode after the power amplifier has substantially reached the final power level.

According to another embodiment of the present invention, a method for initializing a radio transmission apparatus comprising a voltage control oscillator, a phase locked loop, and a power amplifier is disclosed so as to avoid generating unwanted interference in neighboring radio channels. First, the voltage controlled oscillator is enabled and the phase locked loop is switched from a narrow bandwidth mode to a wide bandwidth mode to give faster settling time and reduced overshoot. After the phase locked loop has settled, the phase locked loop is momentarily switched from the wide bandwidth mode to the narrow bandwidth mode and then back again to the wide bandwidth mode so as to charge a narrow band loop filter capacitor. The power amplifier is then smoothly ramped up to a final power level. Finally, the phase locked loop is switched from the wide bandwidth mode to the narrow bandwidth mode after the power amplifier has substantially reached the final power level, wherein a momentary excursion frequency from the desired value has been substantially reduced by charging the narrow band loop filter capacitor.

According to another embodiment of the present invention, a method for changing channels within a radio communication system wherein unwanted interference in neighboring radio channels is avoided is disclosed. First, a phase locked loop within a transmitting apparatus is switched from a narrow bandwidth to a wide bandwidth. A power amplifier ramped to an output power below an established level. Then, a control line voltage of the transmitting apparatus is changed to a voltage corresponding to a new channel. The phase locked loop is then switched from the wide bandwidth to the narrow bandwidth so as to correct the charge on the narrow mode loop filter capacitance. The phase locked loop is switched from the narrow bandwidth to the wide bandwidth, and the power amplifier is ramped-on to a final power level. Finally, the phase locked loop is switched from the wide bandwidth to the narrow bandwidth.

BRIEF DESCRIPTION OF THE DRAWINGS

These and other features and advantages of the invention will be readily apparent to one of ordinary skill in the art from the following written description, read in conjunction with the drawings, in which:

FIG. 5 is a flow chart illustrating another embodiment of the present invention;

DETAILED DESCRIPTION OF THE PREFERRED EMBODIMENTS

Figure 1:
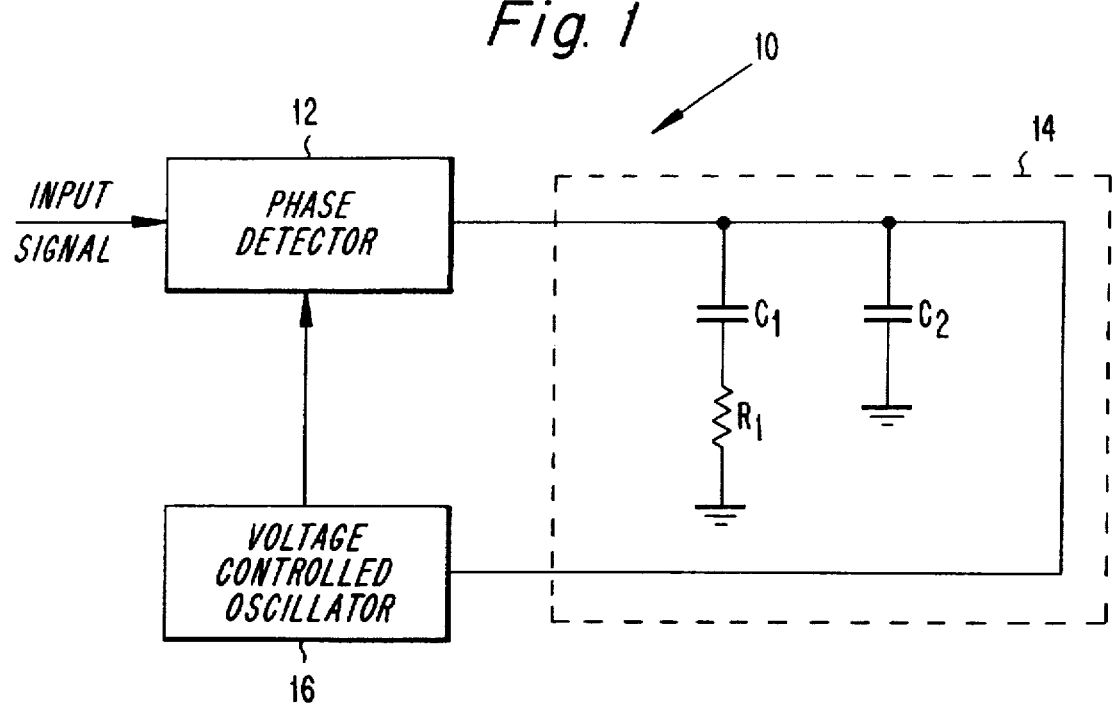
FIG. 1 illustrates a known phase locked loop.
Figure 2:
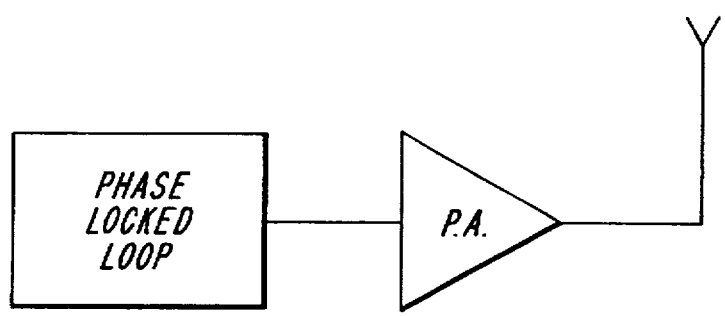
FIG. 2 illustrates a radio transmission apparatus.
Figure 3:
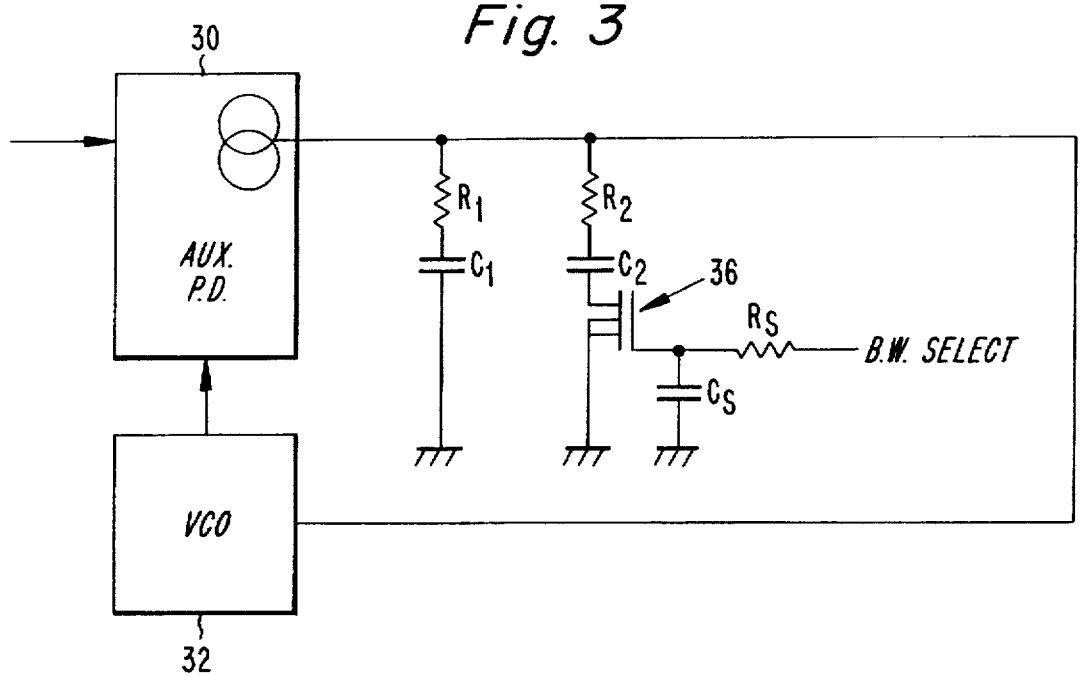
FIG. 3 illustrates a phase lock loop according to one embodiment of the present invention.

FIG. 3 illustrates a phase locked loop according to one embodiment of the present invention. The phase locked loop can consist of a phase detector 30, a voltage control oscillator 32, and a loop filter 34. The phase detector will accept a stable input signal which will be compared to the output signal of the voltage controlled oscillator (VCO). The output signal of the phase detector is representative of the phase difference between the input signal and the output signal of the VCO. The output signal of the phase detector is filtered by the lowpass loop filter and is then used as an error signal to control the VCO, thereby causing the frequency of the VCO to track the frequency of the stable input.

The loop filter in its simplest form is comprised of a single-pole lowpass filter, containing a resistor $R_1$ and a capacitor $C_1$. However, in this embodiment, the lowpass filter also contains a second pole, consisting of a resistor $R_2$ and a capacitor $C_2$, that can be switched in and out of the filter by the transistor $(T_1)$ 36. This structure permits the operation of the phase locked loop in either a wide bandwidth or a narrow bandwidth mode. For the phase locked loop to operate in the narrow bandwidth mode, the bandwidth of the lowpass loop filter must be small, which requires a larger value for the total loop filter capacitance. Since the total capacitance of two capacitors in parallel is the sum of the two capacitances, the phase locked loop is in the narrow bandwidth mode when the second pole is enabled, or when the transistor $T_1$ is on. When the transistor $T_1$ is off, the components $R_2$ and $C_2$ do not affect the operation of the lowpass filter and thus the total capacitance is lower, causing the bandwidth of the lowpass filter to be higher, and consequently, the phase locked loop will be in the wide bandwidth mode.

A second lowpass filter consisting of a resistor $R_s$ and a capacitor $C_s$ can be used to filter the bandwidth control signal to transistor $T_1$ such that the transition from one bandwidth mode to another is not sudden, thereby reducing the frequency kick that can be caused by the transition.

Figure 4:
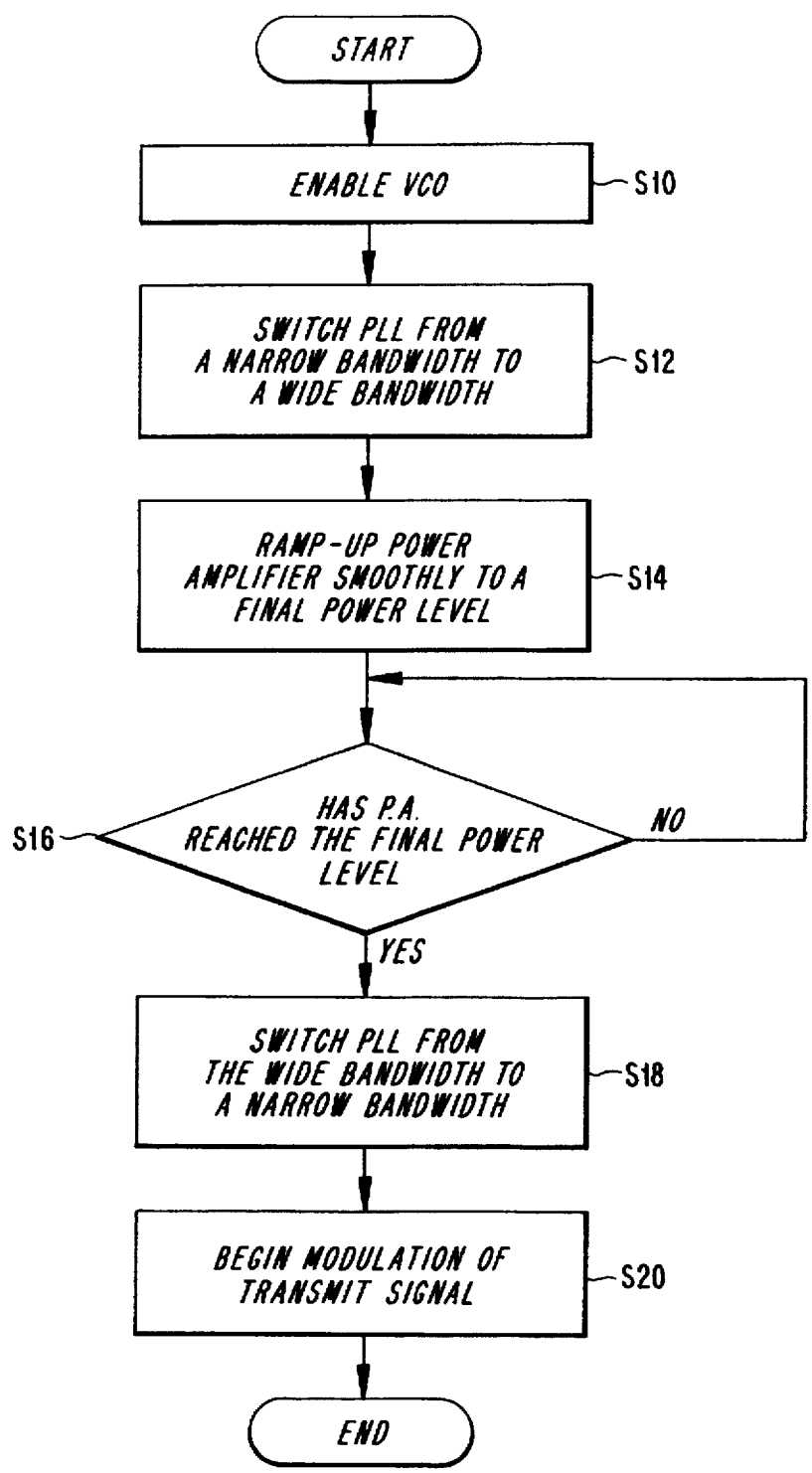
FIG. 4 is a flow chart illustrating one embodiment of the present invention.

A method for initializing a radio transmission apparatus will now be described with reference to FIG. 4. As set forth above, the radio transmission apparatus comprises a voltage controlled oscillator, a phase locked loop, and a power amplifier. Before transmission can begin, the voltage controlled oscillator is enabled in step S10 and the phase locked loop is switched from a narrow bandwidth to a wide bandwidth in step S12 by placing a logic low on the transistor $T_1$ as illustrated in FIG. 3. The phase locked loop is switched to the wide bandwidth mode because the amount of overshoot and settling time introduced by the turning on/off of the transmitter power amplifier is significantly greater for a system with a narrow bandwidth when compared to an equivalent system with a wider bandwidth and high dampening factor. The power amplifier is then ramped on smoothly to a final power level in step S14. The power amplifier is ramped on rather than simply turned on so as to allow the phase locked loop to track the ramp up which keeps the pertabations in the signal fairly minor. Once it is determined in step S16 that the power amplifier has substantially reached the final power level, the phase locked loop is switched from the wide bandwidth mode to the narrow bandwidth mode in step S18. Thus, with the power amplifier turned on and the phase locked loop at the correct bandwidth, i.e., narrow bandwidth, modulation of the transmission signal can begin in step S20.

An additional frequency glitch may occur, however, when switching the loop filter bandwidth from a wide bandwidth mode to a narrow bandwidth mode. This frequency glitch occurs due to the fact that when the loop filter is in the wide bandwidth mode, the low frequency pole consisting of the resistor $R_2$ and the capacitor $C_2$ is left open circuited. Thus, as the phase detector adjusts the charge on the loop filter to tune the VCO to the proper frequency, the capacitor $C_2$ will not receive the new charge but will instead hold the previous charge which is now incorrect. Therefore, when the loop filter is switched back to the narrow bandwidth mode by bringing the resistor $R_2$ and the capacitor $C_2$ back into the circuit, the output frequency of the VCO is pulled back toward the frequency it was operating at when the loop filter was switched to the wide bandwidth mode.

This glitch in the transmitter output frequency can be overcome by the following embodiment of the present invention which is illustrated in FIG. 5. First, the VCO is enabled in step S30. Once the VCO is enabled, the phase locked loop is switched from a narrow bandwidth mode to a wide bandwidth mode in step S32 so that the phase locked loop will settle quickly. After it has been determined that the phase locked loop has settled in step S34, the phase locked loop is momentarily switched to the narrow bandwidth mode and then back again to the wide bandwidth mode, in step S36, so as to place the proper charge on the narrow bandwidth loop filter capacitor. The power amplifier is then smoothly ramped up to a final power level in step S38.

After it has been determined that the power amplifier has substantially reached its final power level in step S40, the phase locked loop is switched from the wide bandwidth mode to the narrow bandwidth mode in step S42. Finally, modulation of the transmission signal can begin in step S44. Since the proper charge was placed on the capacitor $C_2$, when this element was brought back into the circuit in step S42, the frequency glitch is greatly reduced and the transmission apparatus will not interfere with neighboring radio channels.

Figure 6:
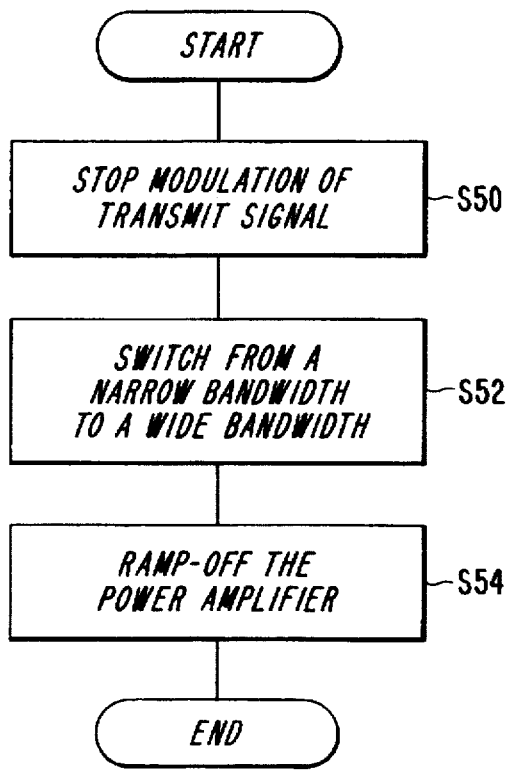
FIG. 6 is a flow chart illustrating another embodiment of the present invention.

The present invention can also be used to prevent unwanted interference in neighboring radio channels when turning off the transmission apparatus as illustrated in FIG. 6. First, the transmission apparatus stops modulation of the transmit signal in step S50. Then, the phase locked loop is switched from a narrow bandwidth mode to a wide bandwidth mode in step S52. Finally, the power amplifier is smoothly ramped down to a very low output power in step S54. By switching the phase locked loop to a wide bandwidth mode and by smoothly ramping down the power amplifier, the generation of unwanted interference in neighboring radio channels is avoided when a transmission apparatus is turned off.

Figure 7:
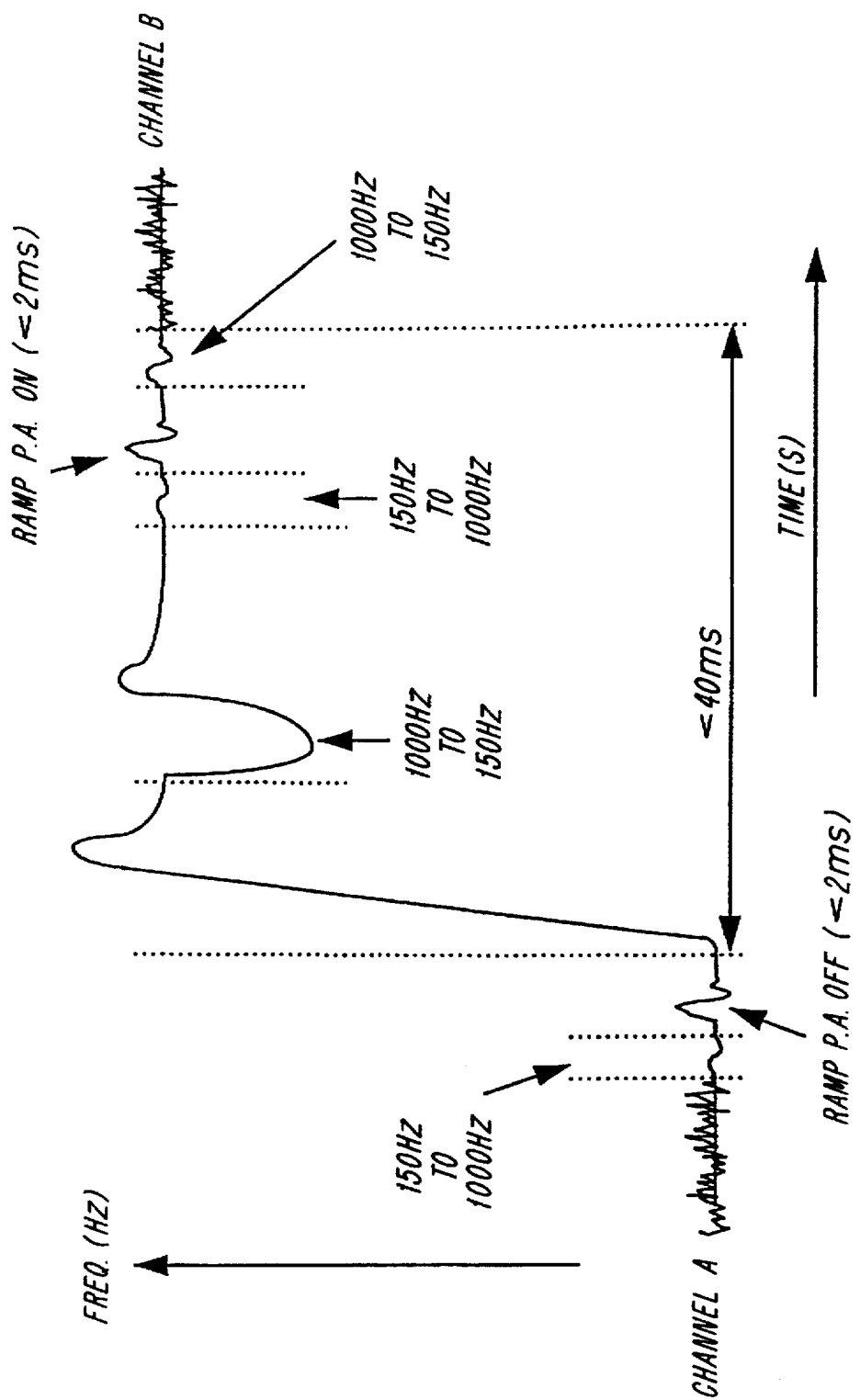
FIG. 7 illustrates a frequency/timing plan according to one embodiment of the present invention.
Figure 8:
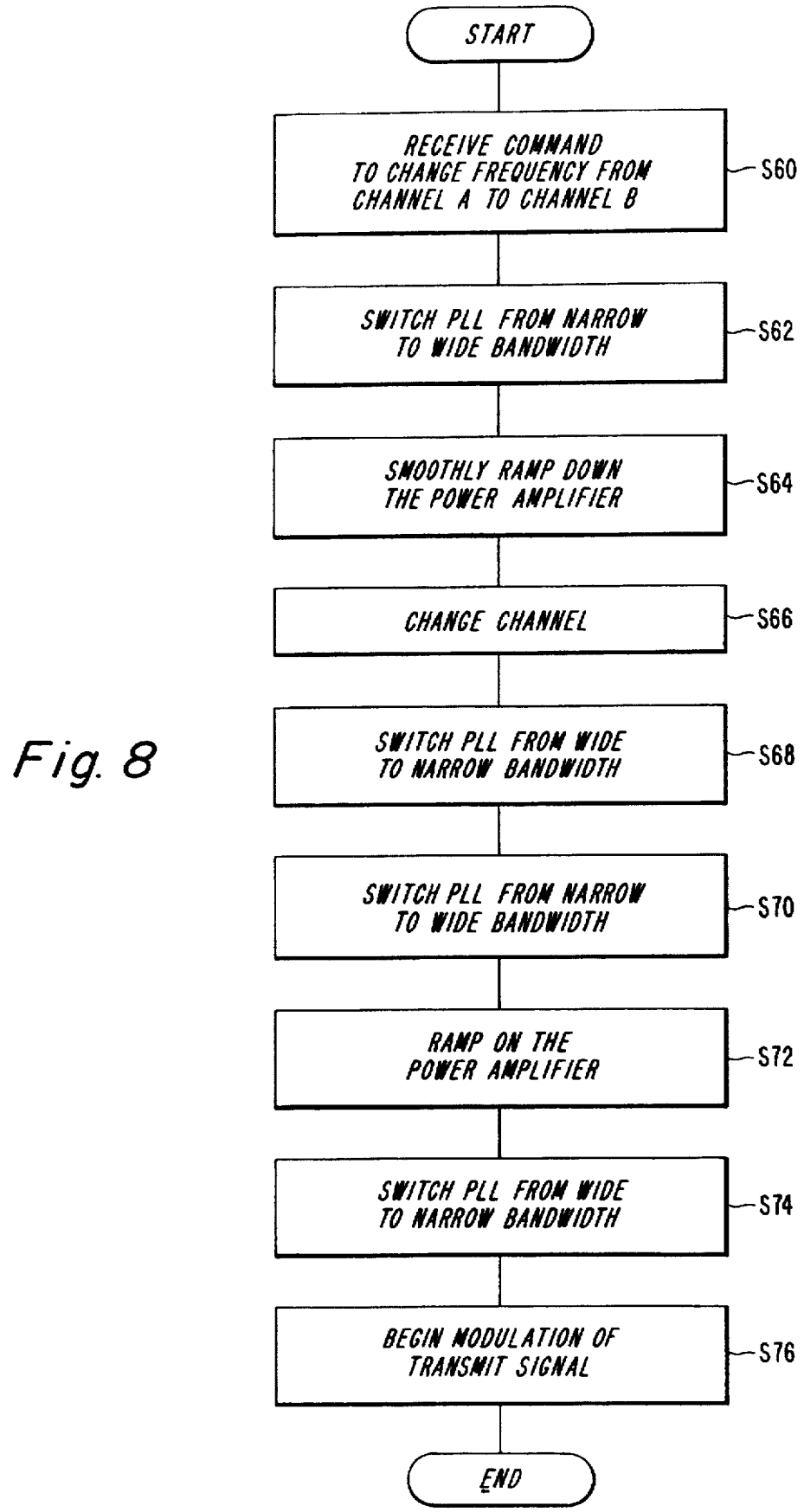
FIG. 8 is a flow chart illustrating a channel switching sequence according to one embodiment of the present invention.

According to another embodiment of the present invention, a method for changing channels within a radio communication system is disclosed wherein unwanted interference in neighboring radio channels is avoided. This embodiment of the present invention will be described in conjunction with FIGS. 7 and 8 which illustrate a frequency/timing plan for changing a transmitting apparatus from channel A to a second channel, channel B, which has a different frequency. As is illustrated in FIG. 7, the radio transmission apparatus is transmitting information on channel A up until the point "A" when the radio transmission apparatus decides or is instructed to switch to channel B in step S60. At this point, the apparatus will cease modulation of the transmit signal. In order to switch from channel A to channel B, the power amplifier must be turned off. However, prior to turning off the power amplifier, the phase locked loop is switched from a 150 Hz bandwidth, i.e., a narrow bandwidth, to a 1000 Hz bandwidth, i.e., a wide bandwidth in step S62. The phase locked loop is switched to the wider bandwidth because the wider the bandwidth in the loop, the faster or less susceptible the phase lock loop is to any disturbances. At point "B", the amplifier is ramped off in step S64. As stated before, the power amplifier is ramped off rather than simply turned off so as to avoid a large frequency kick which may occur when a power amplifier is simply turned off. The slight wiggle in the line when the power amplifier is ramped off is well within the allowable frequency kick. Furthermore, since the signal is not being modulated anymore the signal is basically a carrier and a carrier can be moved plus or minus one half of the assigned bandwidth from the center frequency and still be within band.

The control line voltage of the transmitting apparatus is then changed to that of the channel B line in step S66. As illustrated between points "C" and "D", there is a bit of an overshoot at the edge of the ramp which is basically the damping factor within the loop but the overshoot settles out by the point "D". After point "D", the bandwidth of the phase locked loop is switched from the wide bandwidth mode to the narrow bandwidth mode in step S68. The bandwidth mode of the phase locked loop is switched so as to allow the correct charge to be placed on the capacitor $C_2$. When the charge is being placed on the capacitor $C_2$, the voltage on the control line is varied but eventually settles out by point "E". Since there is no transmission between points "D" and "E", the frequency kick caused by the incorrect charge on the capacitor $C_2$ does not interfere with neighboring radio channels. In step S70, the phase locked loop is then switched back to the wide bandwidth mode between points "E" and "F" and the power amplifier is ramped on between points "F" and "G", in step S72. Since the power amplifier is being ramped on and the phase locked loop is in the wide bandwidth mode, the frequency perturbations are fairly minor and are well within the allowed range. Once the power amplifier has been ramped on, the phase locked loop is changed from the wide bandwidth mode to the narrow bandwidth mode between points "G" and "H", in step S74, and modulation and transmission can now begin on channel B in step S76.

The presently disclosed embodiments are considered in all respects to be illustrative and not restrictive. The scope of the invention is indicated by the appended claims rather than the foregoing description, and all changes which come within the meaning and range of equivalence thereof are intended to be embraced therein.

What is claimed is:

1. A method for initiating a radio transmission apparatus comprising a voltage controlled oscillator, a phase locked loop, and a power amplifier so as to avoid generating unwanted interference in neighboring radio channels, comprising the steps of:

enabling said voltage controlled oscillator;

switching said phase locked loop from a narrow bandwidth to a wide bandwidth to give fast settling;

ramping up said power amplifier smoothly to a final power level; and switching said phase lock loop from said wide bandwidth to said narrow bandwidth after said power amplifier substantially reaches said final power level.

2. A method for initiating a radio transmission apparatus comprising a voltage controlled oscillator, a phase lock loop, and a power amplifier so as to avoid generating unwanted interference in neighboring radio channels, comprising the steps of:

enabling said voltage controlled oscillator;

switching said phase locked loop from a narrow bandwidth to a wide bandwidth to give fast settling;

after said phase lock loop has settled, momentarily switching said phase lock loop from said wide bandwidth to said narrow bandwidth and then back to said wide bandwidth so as to correct the charge on the narrow mode loop filter capacitance;

ramping up said power amplifier smoothly to a final power level; and switching said phase lock loop from said wide bandwidth to said narrow bandwidth after said power amplifier substantially reaches said final power level, wherein a momentary excursion of frequency from the desired value has been substantially reduced by charging said loop filter capacitor.

3. A method for preventing unwanted interference in neighboring radio channels when a transmitting apparatus, containing a phase locked loop and a power amplifier, is turned off, comprising the steps of:

ceasing transmission of information by said transmitting apparatus;

switching said phase locked loop from a narrow bandwidth to a wide bandwidth; and smoothly ramping down said power amplifier to an output power below an established level.

4. A method for changing channels within a radio communication system wherein unwanted interference in neighboring radio channels is avoided, said method comprising the steps of:

switching a phase locked loop within a transmitting apparatus from a narrow bandwidth to a wide bandwidth;

ramping-off a power amplifier to an output power below an established level;

changing a control line voltage of said transmitting apparatus to a voltage corresponding to a new channel;

switching said phase locked loop from said wide bandwidth to said narrow bandwidth so as to correct the charge on the narrow mode loop filter capacitance;

switching said phase locked loop from said narrow bandwidth to said wide bandwidth;

ramping-on said power amplifier to a final power level; and switching said phase locked loop from said wide bandwidth to said narrow bandwidth.

5. A apparatus for initiating a radio transmission apparatus comprising a voltage controlled oscillator, a phase locked loop, and a power amplifier so as to avoid generating unwanted interference in neighboring radio channels, comprising:

means for enabling said voltage controlled oscillator;

means for switching said phase locked loop from a narrow bandwidth to a wide bandwidth to give fast settling;

means for ramping up said power amplifier smoothly to a final power level; and means for switching said phase lock loop from said wide bandwidth to said narrow bandwidth after said power amplifier substantially reaches said final power level.

6. An apparatus according to claim 5, wherein said phase locked loop contains a lowpass filter which contains two primary poles, wherein one of said poles can be enabled or disabled.

7. An apparatus according to claim 6, wherein said switching means is a transistor which switches the second pole into said lowpass filter when the phase locked loop operates in the narrow bandwidth mode.

8. An apparatus according to claim 6, wherein said switching means is a transistor which switches the second pole out of said lowpass filter when the phase locked loop operates in the wide bandwidth mode.

9. An apparatus according to claim 7, wherein said phase locked loop further comprises a second lowpass filter which filters a bandwidth control signal to said transistor so as to reduce a frequency kick which occurs when said phase locked loop is switched between bandwidth modes.

10. A apparatus for changing channels within a radio communication system wherein unwanted interference in neighboring radio channels is avoided, said apparatus comprising:

means for switching a phase locked loop within a transmitting apparatus from a narrow bandwidth to a wide bandwidth;

means for ramping-off a power amplifier to an output power below an established level;

means for changing a control line voltage of said transmitting apparatus to a voltage corresponding to a new channel;

means for switching said phase locked loop from said wide bandwidth to said narrow bandwidth so as to correct the charge on the narrow mode loop filter capacitance;

means for switching said phase locked loop from said narrow bandwidth to said wide bandwidth;

means for ramping-on said power amplifier to a final power level; and means for switching said phase locked loop from said wide bandwidth to said narrow bandwidth.

11. An apparatus according to claim 10, wherein said phase locked loop contains a lowpass filter which contains two poles.

12. An apparatus according to claim 11, wherein said switching means is a transistor which switches the second pole into said lowpass filter when the phase locked loop operates in the narrow bandwidth mode.

13. An apparatus according to claim 11, wherein said switching means is a transistor which switches the second pole out of said lowpass filter when the phase locked loop operates in the wide bandwidth mode.

14. An apparatus according to claim 12, wherein said phase locked loop further comprises a second lowpass filter which filters a bandwidth control signal to said transistor so as to reduce a frequency kick which occurs when said phase locked loop is switched between bandwidth modes.

15. A method for changing channels within a radio communication system wherein unwanted interference in neighboring channels is avoided, said method comprising the steps of:

switching a phase locked loop within a transmitting apparatus from a narrow bandwidth to a wide bandwidth;

ramping-off a power amplifier to an output power level below an established level;

changing a control line voltage of said transmitting apparatus to a voltage corresponding to a new channel;

ramping-on said power amplifier to a final power level; and switching said phase locked loop from said wide bandwidth to said narrow bandwidth.

* * * * *